United States Patent [19]

Bongiorno

[11] 4,229,706
[45] Oct. 21, 1980

[54] AUDIO AMPLIFIER

[76] Inventor: James W. Bongiorno, 1230 N. Horn St., North Hollywood, Calif. 90069

[21] Appl. No.: 1,225

[22] Filed: Jan. 5, 1979

[51] Int. Cl.³ .............................................. H03F 3/26
[52] U.S. Cl. .................................. 330/272; 330/273; 330/297
[58] Field of Search ............... 330/146, 199, 202, 262, 330/266, 267, 272, 273, 296, 297, 298, 207 P

[56] References Cited

U.S. PATENT DOCUMENTS

| 2,877,310 | 3/1959 | Donald | 330/146 X |
| 3,351,866 | 11/1967 | Goldsmith | 330/273 |
| 3,383,613 | 5/1968 | Novak | 330/146 X |

*Primary Examiner*—James B. Mullins
*Attorney, Agent, or Firm*—Spensley, Horn, Jubas & Lubitz

[57] ABSTRACT

Disclosed is a Class A power amplifier circuit which includes means for controlling the quiescent bias current of the output devices of the amplifier and providing absolute overload and short circuit protection without the need of extra protective devices of any kind. The circuit includes a driver stage which amplifies an input signal and provides two outputs which are out of phase with respect to each other by 180°. One output of the driver stage provides a drive signal to the control input of a first output device, while the other output of the driver stage provides a drive signal to the control input of a second output device. Power is provided to the driver stage by a standard grounded center-tapped power supply. A pair of independent floating power supplies are cross-connected between the two output devices so that the supply terminal of each output device is connected to one terminal of one of the power supplies, while the output terminal of each of the output devices is connected to the opposite phase terminal of the opposite power supply. A resistor is connected between the output terminal of each of the output devices and one terminal of the power supply which powers the driver stages. The load is connected between output terminals of the output devices. The circuit arrangement provides control of the value of the quiescent control input current of each of the output devices which in turn controls the quiescent value of the bias currents of each of the output devices, thus resulting in an amplifier of greatly improved thermal stability.

13 Claims, 2 Drawing Figures

AUDIO AMPLIFIER

BACKGROUND OF THE INVENTION

A problem which has plagued design engineers for years is that of designing a stable Class A solid-state high power amplifier. A Class A amplifier is one in which the quiescent current that is used to bias the output devices of the amplifier is set so that the maximum signal swing is still within the normal operating range of the transistors (i.e., within the linear range of the transistors). Due to the characteristics of the transistors themselves, it has been almost impossible to maintain a stable bias current under all operating conditions. The problem stems from the fact that there are two temperature dependent parameters which generally come into play in solid-state Class A amplifiers, as well as other types of amplifiers. Initially, the base to emitter voltage ($V_{be}$) of a silicon transistor changes at a rate of 2 mv/°C. Secondly, the Beta (hfe), which is the forward current transfer ratio (or gain) of a transistor, will increase with temperature up to a peak and then rapidly fall. The maximum point is known as the current density knee. The quiescent bias current $I_c$ of a transistor is a function of the two temperature dependent variables, i.e., the base to emitter voltage and the Beta of the transistor. The base to emitter voltage/$I_c$ relationship is an exponential one. Therefore, a large change in temperature will result in an exponential change in the bias current of the transistor, thus causing instability.

Another problem in the design of Class A transistor amplifiers is that the thermal time constant (i.e., the time from a step change in power dissipation until the junction temperature reaches 63.2% of the final value of junction temperature change) of a silicon transistor is such that a short-term temperature rise can occur in the chip of the transistor within a period of about 10 milliseconds. This in turn can cause a large change in the quiescent bias current which in turn can lead to thermal runaway, causing the transistors to self-destruct before any corrective circuits have time to react. Thermal stability may be achieved in a Class A amplifier by controlling the quiescent bias current. However, since the quiescent bias current is a function of two temperature dependent variables, such control is extremely difficult. If one or both of these variables could be eliminated, it would be much easier to control the quiescent bias current.

Heretofore, several methods have been used to provide bias current stability. One of these is passive thermal coupling between the transistors and the bias network. In this approach, the bias network which controls the bias current is bonded as close to the output devices on the heat sinks of an amplifier as is possible, so as to share thermal equilibrium. This approach has several problems, however. One of these is that the heat sink itself may have a variable thermal gradient, thus preventing thermal equilibrium from being achieved. Secondly, the output transistors themselves may have a variable junction to case thermal gradient which would prevent thermal equilibrium from being achieved. Finally, the tracking characteristics of the bias network may be such that they cannot track a rapid change in temperature, and thus bias current, with the result that thermal runaway occurs. These problems may be overcome by operating the output transistors beyond the current density knee in the Beta vs. temperature curve. Since the Beta of a transistor decreases with an increase in temperature beyond the current density knee, thermal runaway might be prevented in such case. Tradeoffs associated with this type of operation, however, are that the output transistors are operated at a high temperature, which may lead to short life, and that the transistors are operating near their nonlinear region, with a resultant increase in distortion. In addition, such designs usually employ large stabilization resistors resulting in a substantial waste of power.

A second method of achieving bias stability in Class A amplifiers has been to actively sense and control the bias current by servo action. In this scheme, an active negative feedback circuit is used to sense the output stage quiescent current and provide control over it. Such circuits have an inherent time delay in the corrections provided by them, however, with the resultant possibility that thermal runaway might occur before the feedback circuit has time to make corrections.

In view of the above, it is a primary object of the present invention to achieve a design for a Class A transistor power amplifier which has absolute quiescent current stability under the worst possible environmental conditions of ambient temperature rise.

It is a further object of the present invention to achieve bias current stability while at the same time having an amplifier of low distortion, wide bandwidth and high power.

It is another object of the present invention to eliminate the effect of changes of the transistor parameter of base to emitter voltage with a change in temperature in the design of solid-state Class A amplifiers.

It is a further object of the invention to achieve bias current stability by completely passive means.

It is another object of the invention to eliminate any time constants in bias current control so as to permit instantaneous control of bias current and prevent thermal instability.

It is a further object of this invention to achieve a design for a Class A amplifier which is inherently linear. Specifically, the design results in an amplifier having an open loop distortion of less than 0.1% from 20 Hz to 20 kHz when the amplifier is operated below clipping. This distortion may be further reduced by the application of negative feedback.

It is another object of the present invention to design a Class A transistor power amplifier which operates well within the linear region of the output transistors of the amplifier.

It is another object of the invention to provide an amplifier having inherent immunity from short circuit problems without the need of additional protective circuitry.

SUMMARY OF THE INVENTION

These and other objects are achieved by utilizing two floating independent supply voltages to form control loops to effectively keep the quiescent base current of the output transistors constant and thus negate the parameter of the base to emitter voltage vs. temperature. The amplifier design is push-pull, with the output transistors being connected in a full bridge fashion. A center-tapped power supply supplies power to a driver which provides two opposite phase drive signals to a pair of output devices. The output devices may include any number of transistors arranged in any configuration, and are characterized in that they have an input terminal, an output terminal and a supply terminal. The output terminal of each of the output devices is connected to the negative terminal of the driver power supply through a high impedance resistor so as to form current loops which control the value of the control input current to the output devices and therefore the quiescent output device supply current ($I_c$). The supply terminal of one of the output devices is connected to the positive terminal of one of the floating independent power supplies, and the supply terminal of the other device is connected to the positive terminal of the other floating independent power supply. A load is connected between the output terminals of the output devices, and the negative terminals of the floating power supplies are connected across the load in a criss-cross fashion so that they are effectively boot-strapped. The design results in an amplifier having extremely high quiescent bias current stability and thermal stability.

BRIEF DESCRIPTION OF THE DRAWINGS

In the drawings, wherein like numbers refer to like elements.

DETAILED DESCRIPTION OF THE DRAWINGS

Figure 1:
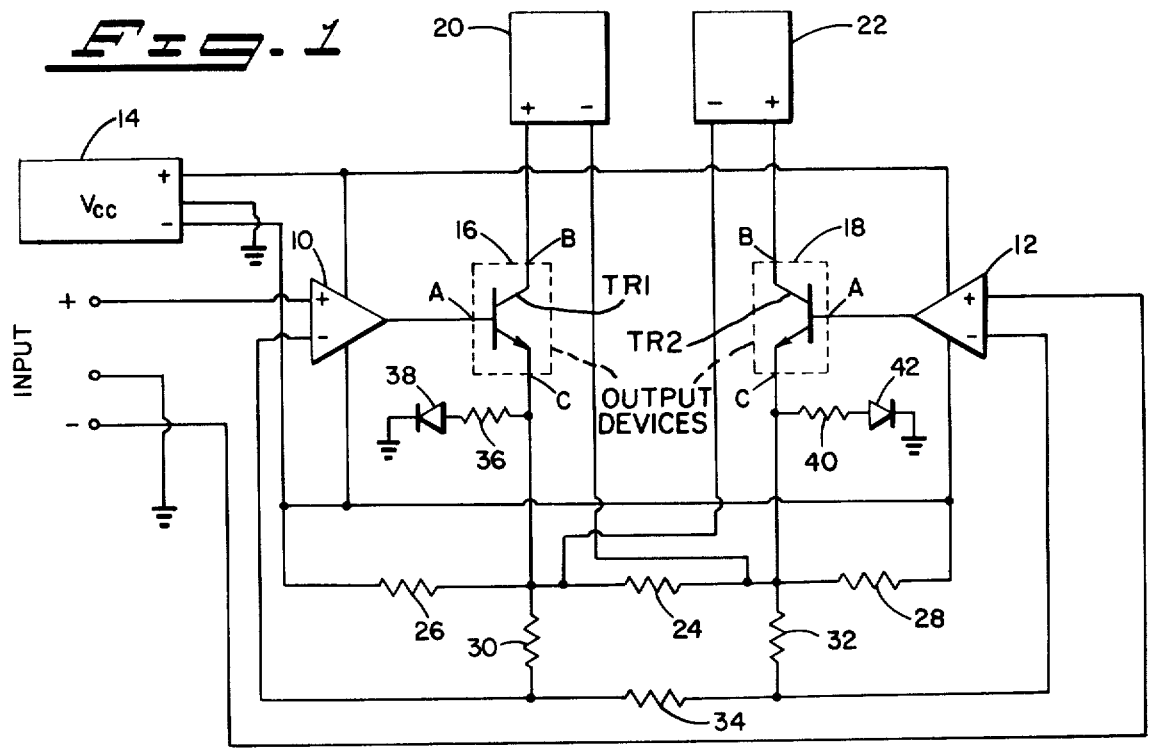
FIG. 1 is a partial schematic, partial block diagram of the amplifier of the present invention.

Referring to FIG. 1, an input signal in balanced or unbalanced form is delivered to the inputs of a pair of driver stages 10 and 12. The outputs of the driver stages 10 and 12 are of opposite phase, i.e., they are out of phase with respect to each other by 180°. The type of circuits which are used for the driver stages 10 and 12 are not critical to the invention, and any one of many different designs could be utilized. This could include the use of one device having two opposite phase outputs. The driver stages 10 and 12 are powered by means of a grounded center-tap power supply 14 which supplies both positive and negative operating voltages to the driver stages 10 and 12. The outputs of the driver stages 10 and 12 are fed to the control inputs of a pair of solid-state output devices 16 and 18, respectively. Although for purposes of clarity the output devices 16 and 18 are shown as having only one output transistor TR1 and TR2, respectively, they may represent any number of devices in any configuration. For example, they may be a number of transistors connected in a parallel fashion, or in a compound configuration. The output drivers 16 and 18 are characterized in that they have a control input A, a supply input B and an output C. The outputs of the driver stages 10 and 12 are connected to the control inputs 16A and 18A, respectively. The outputs 16C and 18C of the devices 16 and 18 are connected across a load 24, which may be a speaker or any other load. The supply terminal 16B is connected to the positive terminal of a power supply 20, and the supply terminal 18B is connected to the positive terminal of a power supply 22. The power supplies 20 and 22 are floating and completely independent from one another and with respect to the power supply 14. The negative terminals of the power supplies 20 and 22 are connected to opposite sides of the load 24 so that the negative terminal of the power supply 20 is connected to the output 18C and the negative terminal of the power supply 22 is connected to the output 16C. Finally, a resistor 26 is connected between the negative terminal of the power supply 14 and the output 16C, and a resistor 28 is connected between the negative terminal of the power supply 14 and the output 18C. The values of the resistors 26 and 28 are sufficiently high so as to approximate a current source as far as the output devices 16 and 18 are concerned. Typically, with the power supply voltage used in the present embodiment of the invention, the resistors 26 and 28 will have a value of at least 500 ohms (since the control input to output impedance of the output devices 16 and 18 is generally on the order of 1 ohm or less), although the value is not critical.

In the above circuit, a pair of independent current loops are formed which are utilized to control the bias current of the output devices 16 and 18. A first current loop is set up which passes from the positive terminal of the power supply 14 through the driver stage 10 through the output device 16 (which corresponds to the base to emitter junction in the transistor shown), through the resistor 26 and back to the negative terminal of the power supply 14. Similarly, a loop is formed which passes from the positive terminal of the power supply 14 through the driver stage 12, through the control input/output junction of the output device 18, through the resistor 28 and back to the negative terminal of the power supply 14. Although the negative terminals of the power supplies 20 and 22 are connected to the resistors 28 and 26, respectively, no connections exist between the supplies 20 and 22 which would form return paths for the currents through the resistors 28 and 26. Therefore, the only path for the currents through the resistors 26 and 28 are through the control input/output junctions of the output devices 16 and 18. Since all of the current passing through the inputs 16A and 18A and leaving the outputs 16C and 18C (i.e., the control input current) must pass through the resistors 26 and 28 respectively, and since the values of the resistors 26 and 28 are high enough to act as effective current sources with respect to the output devices 16 and 18, the quiescent value of this current will therefore be held constant. This in turn will cause the quiescent supply or bias current of the output devices 16 and 18 to be constant. Therefore, the base to emitter voltage parameter in a single transistor, which is one of the temperature dependent parameters which can cause a change in the bias current of the output transistors of an amplifier is eliminated. The control current loops serve to keep the output stage quiescent bias current, which is termed $I_c$, constant despite any changes in the temperature of the output devices 16 or 18. Thus, any parameters of the output devices 16 and 18 which correspond to the change in base to emitter voltage with temperature for a single output transistor are completely negated in the circuit of FIG. 1, since the control input current is effectively locked to a particular quiescent value. Furthermore, the values of the resistors 26 and 28 may be used to control the value of the quiescent bias current which is supplied to the output devices 16 and 18 by the power supplies 20 and 22. This is so because the control input current to the output devices 16 and 18 is a function of the value of the resistors 26 and 28, respectively, and the quiescent output stage bias current is in turn a function of the quiescent control input current of the output devices 16 and 18. Therefore, the quiescent bias current is also a function of the value of the resistors 26 and 28. The resistors 26 and 28 are chosen so as to bias the output devices 16 and 18 so that they operate in a true Class A fashion.

When an output signal is received, the output of the driver stage 10 will be going positive as the output of the driver stage 12 is going negative, because of the opposite phase relationship between the driver stages 10 and 12. This will cause more voltage to be developed across the resistor 26, thus increasing the output current of the output device 16 and causing it to be developed across the load resistor 24. Since the opposite end of the load resistor 24 is connected to the negative terminal of the supply 20, a complete loop is formed for the current flow (i.e., from the positive terminal of the power supply 20 through the output device 16, through the load resistor 24 and back to the negative terminal of the power supply 20). Since the output of the driver stage 12 and thus the output device 18 is going in a negative direction, the voltage across the resistor 28 decreases and therefore the supply or bias current, designated $I_c$ and corresponding to the collector current $I_c$ of an individual output transistor, must also decrease. The power supplies 20 and 22, however, are effectively bootstrapped to the opposite ends of the load resistor 24. Due to this, the voltages at the supply terminals of the output devices 16 and 18 will rise and fall according to the output signal.

It can thus be seen that the circuit of FIG. 1 eliminates one of the two temperature dependent parameters which exist in the output transistor of Class A amplifiers, namely, the variation of the base to emitter (i.e., control input to output) voltage with temperature. With only one temperature dependent parameter remaining (the change of Beta of a transistor vs. temperature), the possibility of thermal runaway is greatly reduced, since the quiescent bias current may be maintained at a much more stable level.

A further advantage of the circuit of FIG. 1 is that protection against output short circuits or very low impedance loads is inherent in the design, and no additional protection devices are needed. This is so because under short circuit conditions, the output quiescent voltage will be at zero volts with respect to ground, since at zero output the voltage drop across the resistors 26 and 28, and therefore the output stage quiescent current, is constant. Therefore, there is no increase in dissipation under short circuit (or low impedance) conditions.

Referring further to FIG. 1, negative feedback may be added to the circuit by means of the interconnection of a resistor 30 between the output of the output device 16 and the negative input of the driver stage 10, a resistor 32 between the output of the output device 18 and the negative input of the driver stage 12, and a resistor 34 connected between the negative inputs of the driver stages 10 and 12. In addition, the drive current (i.e., control input current) to the output devices 16 and 18 and subsequent output current may be increased by connecting a resistor 36 between the output terminal of the output device 16 and the anode of a diode 38 whose cathode is connected to ground. Similarly, a resistor 40 is connected between the output terminal of the output device 18 and the anode of a diode 42 whose cathode is connected to ground. Since the diodes 38 and 42, which may be any type of threshold device (e.g., zener), prevent conduction until they are forward biased to at least the threshold value of forward voltage drop (e.g., 0.6 V for all silicon diodes), the two resistor-diode networks only come into play when the output voltage of the amplifier is driven past the threshold voltage of the diodes 38 or 42. Therefore, under short circuit conditions, the resistor-diode networks will not contribute to any increase in the output device supply current, and thus will not affect the self-protection inherent in the amplifier design. The resistors 26 and 28 may be chosen so as to bias the output devices 16 and 18 so that the circuit operates in a Class B fashion when the resistor-diode networks are employed. In such a case, the resistors 36 and 40 and diodes 38 and 42 act as a load for the drive current which is required for Class B operation, since the current through resistors 26 and 28 would be insufficient to drive a load.

Figure 2:
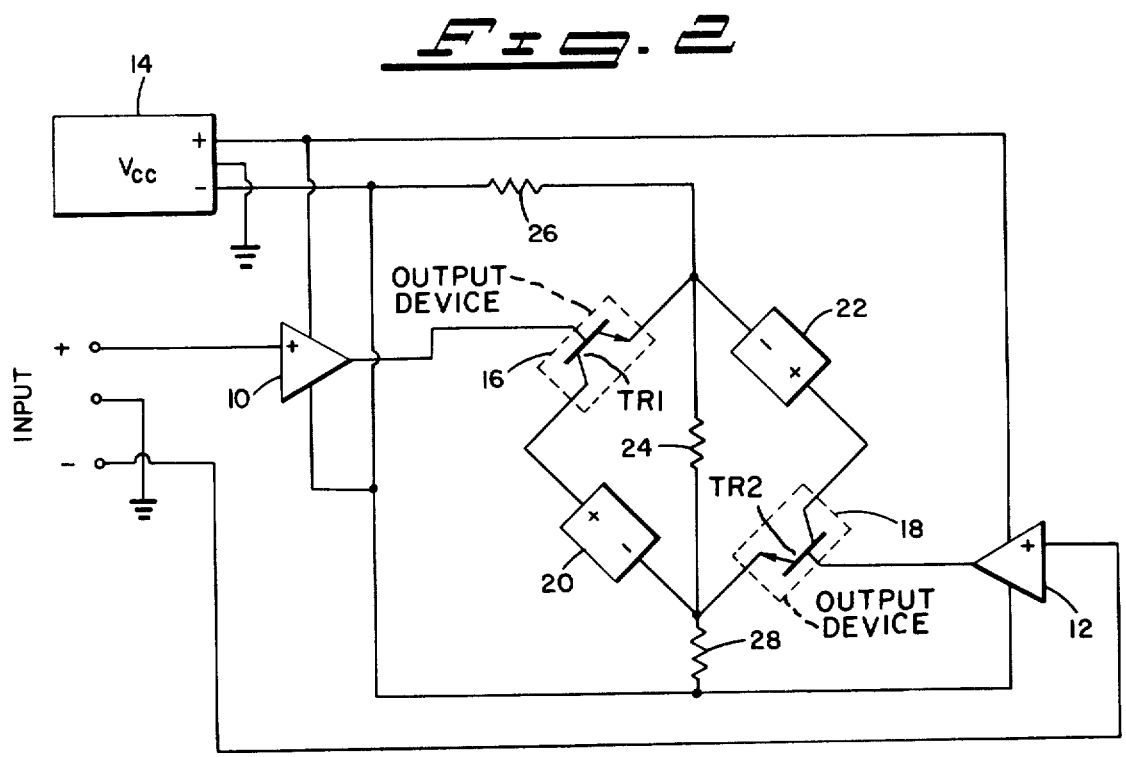
FIG. 2 shows the basic circuit of FIG. 1 connected to illustrate the bridge arrangement of the inventive circuit.

As may be seen more clearly in FIG. 2, the output circuit of the present invention operates as a bridge, the opposite sides of which consist of a floating battery (the power supplies 20 and 22) series connected with an output device (16 and 18, respectively). The load 24 is connected across the bridge. It should be appreciated that the electrical connections of FIG. 2 are identical to those of FIG. 1. The output devices 16 and 18 are provided with equal quiescent bias current so that there is zero output across the bridge under quiescent conditions. Input signals of opposite phase are provided to the output devices 16 and 18 so that as the current through one of them is rising above the quiescent value, the current through the other is falling below the quiescent value by a like amount, thus creating an output across the load 24. The quiescent bias levels of the output devices is controlled by a pair of control current loops which do not go through the bridge or the batteries. The control currents are established by high impedance resistors (26 and 28) which act as current sources and force a fixed amount of current through the control input to output junction of the output devices under quiescent conditions. This effectively locks the quiescent control input current of the output devices at a fixed value despite any temperature changes that might occur. This in turn controls the value of the quiescent bias current of the output devices 16 and 18, resulting in an amplifier circuit of high thermal stability.

Although the invention has been described in terms of one particular configuration, it should be understood that many modifications could be made without departing from the scope of the invention. Specifically, either NPN or PNP transistors, or a combination thereof could be utilized. The invention generally comprises a bridge having a first floating power supply connected with one polarity in series with a first transistor amplifying device across two opposite nodes of the bridge, and a second floating power supply connected with opposite polarity in series with a second transistor amplifying device across the same two nodes, and a load being connectable across the nodes. Independent high impedance current source bias circuits connected to the amplifying devices maintain the base to emitter voltage of the transistor devices regardless of any temperature changes.

I claim:
1. A solid-state amplifier, comprising:
   driver means for amplifying an input signal, said driver means having two outputs;
   first and second solid-state output devices having a control input terminal, a supply terminal and an output terminal, wherein the control input terminal of the first output device is connected to one output of said driver means and the control input terminal of the second output device is connected to the other output of said driver means;

driver power supply means for powering said driver means;

first floating independent supply means for powering said first output device;

second floating independent supply means for powering said second output device; and passive control means for maintaining the quiescent value of the control input current to said first and second output devices at a constant, predetermined level despite temperature variations in the output devices.

2. The amplifier of claim 1 wherein said control means includes a first control resistor connected between the output terminal of said first output device and said driver power supply means, and a second control resistor connected between the output terminal of said second output device and said driver power supply means.

3. A solid-state amplifier comprising:

a driver means for providing two drive signals of opposite phase;

first and second solid-state output devices, each of said output devices having a control input terminal, a supply terminal and an output terminal, wherein the control terminal of the first output device is connected to one output of said driver means and the control terminal of the second output device is connected to the other output of said driver means;

driver power supply means for providing operating voltages to said driver means;

a first control resistor connected between the output terminal of said first output device and a terminal of said driver power supply means;

a second control resistor connected between the output terminal of said first output device and a terminal of said driver power supply means;

a first floating independent power supply, the positive terminal of which is connected to the supply terminal of said first output device and the negative terminal of which is connected to the output terminal of said second ooutout device; and a second floating independent power supply, the positive terminal of which is connected to the supply terminal of said second output device and the negative terminal of which is connected to the output terminal of said first output device, said amplifier being utilized to drive a load which is connected between the output terminals of said first and second output devices.

4. The amplifier of claim 1 wherein said amplifier is a Class A amplifier.

5. The amplifier of claim 1 further including negative feedback means connected between the input of said driver means and the output terminals of said first and second output devices.

6. The amplifier of claim 1 wherein each of said output devices comprises a single transistor, the base of which is connected to the control input terminal of the output device, the collector of which is connected to the supply terminal of the output device, and the emitter of which is connected to the output terminal of the output device.

7. The amplifier of claim 1 wherein each of said output devices comprises a plurality of transistors connected in a parallel fashion.

8. The amplifier of claim 1 wherein each of said output devices comprises a plurality of transistors connected in a compound configuration.

9. The amplifier of claim 1 further including:

a first resistor having one lead connected to the output terminal of said first output device, and a diode whose anode is connected to the other lead of said first resistor, and whose cathode is connected to ground; and a second resistor having one lead connected to the output terminal of said second output device, and a diode whose anode is connected to the other lead of said second resistor and whose cathode is connected to ground.

10. A bridge connected output stage for an amplifier comprising:

a first output device having a control input, a supply input and an output;

a first floating independent power supply, the first terminal of which is connected to the supply input of said first output device, said first output device and said first power supply forming one side of a bridge;

a second output device having a control input, a supply input and an output, said output being connected to the second terminal of said first power supply;

a second floating independent power supply, one terminal of which is connected to the supply input of said second output device and the other terminal of which is connected to the output terminal of said first output device, said second output device and said second power supply forming the other side of the bridge;

a third power supply; and passive means, connected to the third power supply, for maintaining the quiescent value of the control input current to said output devices at a constant level despite temperature variations in the output devices.

11. A linear audio amplifier comprising:

a bridge having a first floating power supply connected with one polarity in series with a first transistor amplifying device across two opposite nodes of said bridge, and a second floating power supply connected with opposite polarity in series with a second transistor amplifying device across the same two nodes, a load being connectable across said same nodes;

independent first and second high impedance current source bias circuits respectively connected to said first and second transistor amplifying devices, each of said bias circuits including a passive current control element and providing a current which is entirely constrained to the base-to-emitter path of the associated transistor amplifying device whereby no bias current flows through either floating power supply, the current provided by each current source being determined by said passive element so that said bias circuit maintains the base current of that associated transistor device constant regardless of temperature change; and drive means for supplying corresponding but oppositely phased audio signals to the inputs of said first and second transistor devices.

12. A linear audio amplifier according to claim 11 wherein said bias circuits provide currents having values such that each transistor amplifying device is biased to operate in the linear range thereof, said amplifier thus operating in the Class A mode.

13. A linear amplifier according to claim 11 wherein each of said transistor amplifying devices comprises at least one transistor, each transistor being poled for forward current flow from the corresponding floating power supply through the collector-to-emitter path of that transistor, and wherein the impedance of said current source is established by a resistor in said bias circuit through which said bias current flows, the resistance of said resistors being substantially greater than the base-to-emitter impedance of the corresponding transistor.

* * * * *